United States Patent
Yoo et al.

(10) Patent No.: US 8,283,567 B2
(45) Date of Patent: Oct. 9, 2012

(54) FLEXIBLE PRINTED CIRCUIT BOARD AND TOUCH SCREEN PANEL APPARATUS HAVING THE SAME

(75) Inventors: Young-Seok Yoo, Yongin (KR); Hyun-Wook Cho, Yongin (KR)

(73) Assignee: Samsung Display Co., Ltd., Yongin, Gyunggi-do (KR)

( * ) Notice: Subject to any disclaimer, the term of this patent is extended or adjusted under 35 U.S.C. 154(b) by 64 days.

(21) Appl. No.: 12/929,692

(22) Filed: Feb. 9, 2011

(65) Prior Publication Data
US 2012/0057312 A1 Mar. 8, 2012

(30) Foreign Application Priority Data
Sep. 7, 2010 (KR) .................. 10-2010-0087522

(51) Int. Cl.
*H05K 1/00* (2006.01)
(52) U.S. Cl. ........... 174/254; 361/749; 345/173; 439/66
(58) Field of Classification Search .......... 361/749, 361/827, 784, 785, 789, 748; 174/254, 251; 439/66; 345/173–177
See application file for complete search history.

(56) References Cited

U.S. PATENT DOCUMENTS

| | | | |
|---|---|---|---|
| 7,338,913 B2 * | 3/2008 | Kasahara et al. | 438/795 |
| 8,115,499 B2 * | 2/2012 | Osoinach et al. | 324/686 |
| 2005/0191872 A1 * | 9/2005 | Tanabe et al. | 439/67 |
| 2008/0191380 A1 * | 8/2008 | Yu | 264/157 |
| 2008/0227308 A1 | 9/2008 | Fujii et al. | |
| 2009/0283300 A1 * | 11/2009 | Grunthaner | 174/254 |
| 2011/0132642 A1 | 6/2011 | Shinoda et al. | |
| 2011/0134052 A1 * | 6/2011 | Tsai et al. | 345/173 |

FOREIGN PATENT DOCUMENTS

| | | |
|---|---|---|
| EP | 2334157 A2 | 6/2011 |
| KR | 10 2006-0055873 A | 5/2006 |
| KR | 10-2006-0055873 A | 5/2006 |
| KR | 10-0671-653 A | 1/2007 |
| KR | 10-0671653 B1 | 1/2007 |
| KR | 10-2008-0091900 A | 10/2008 |
| KR | 10 2008-0091900 A | 10/2008 |
| KR | 10 2009-0059625 A | 6/2009 |
| KR | 10-2009-0059625 A | 6/2009 |

OTHER PUBLICATIONS

European Search Report in EP 11179777.5-1232, dated Oct. 25, 2011 (Yoo, et al.).

* cited by examiner

*Primary Examiner* — Hoa C Nguyen
(74) *Attorney, Agent, or Firm* — Lee & Morse, P.C.

(57) ABSTRACT

A flexible printed circuit board (FPCB) simultaneously coupled to both surfaces of a substrate structure, e.g., a touch screen panel is provided. The FPCB includes a main substrate unit having a first pad unit and an auxiliary substrate unit extending from the main substrate unit to one side of the first pad unit. The auxiliary substrate unit includes a first substrate unit positioned parallel with the first pad unit along a first direction, a second substrate unit including a second pad unit, the second substrate unit spaced apart from the first substrate unit in a second direction, orthogonal to the first direction, and a plurality of third substrate units extending along the second direction between the first and second substrate units.

14 Claims, 5 Drawing Sheets

FLEXIBLE PRINTED CIRCUIT BOARD AND TOUCH SCREEN PANEL APPARATUS HAVING THE SAME

BACKGROUND

1. Field

Embodiments relate to a flexible printed circuit board (FPCB) and a touch screen panel apparatus having the same, and more particularly, to a flexible printed circuit board (FPCB) that may be simultaneously coupled to both surfaces of a substrate structure, e.g., a touch screen panel, and a touch screen panel apparatus having the same.

2. Description of the Related Art

A touch screen panel is an input apparatus through which a user's command may be input by selecting instruction contents displayed on a screen of an image display apparatus and the like by a finger of a person or an object.

To this end, the touch screen panel is provided on the front surface of the image display apparatus to convert a contact position at which the finger of the person or the object directly makes contact with the touch screen panel into an electrical signal. Thus, the instruction contents selected at the contact position are regarded as an input signal.

Since the touch screen panel may replace a separate input apparatus coupled to an image display apparatus to operate, e.g., as a keyboard and a mouse, the use of the touch screen panels is increasing.

A resistance layer method, a photosensitive method, and an electrostatic capacity method are known as a method of realizing the touch screen panel. The electrostatic capacity method includes a plurality of sensing electrodes dispersed in an active touch region. Therefore, the point at which the electrostatic capacity changes is detected when a finger or an object contacts the touch screen panel to determine the contact position. The sensing electrodes are dispersed on one surface, e.g., a top surface of the touch screen panel.

A driving/shield electrode may be formed on another surface, e.g., on a rear surface of the touch screen panel. The driving/shield electrode may be used as a driving electrode (another driving electrode than the sensing electrodes) of the touch screen panel, or may be coupled to a constant voltage source, e.g., a ground power source, to be used as a shield electrode for securing stability between the touch screen panel and a display panel.

SUMMARY

Embodiments are directed to providing a flexible printed circuit board (FPCB) capable of being simultaneously coupled to both surfaces of a substrate structure, e.g., a touch screen panel, with a relatively simple coupling structure and a touch screen panel apparatus having the same.

Embodiments are also directed to providing a FPCB capable of improving alignment correctness and a touch screen panel apparatus having the same.

Embodiments are also directed to providing a FPCB capable of improving coupling stability and a touch screen panel apparatus having the same.

At least one of the above and other features and may be realized by providing a flexible printed circuit board (FPCB), including a main substrate unit at whose one end a first pad unit is provided and an auxiliary substrate unit extended from the main substrate unit to one side of the first pad unit. The auxiliary substrate unit includes a first substrate unit positioned to run parallel with the first pad unit, a second substrate unit provided to face the first substrate unit and including a second pad unit, and a plurality of third substrate units extended to corresponding both sides of the first substrate unit and the second substrate unit to integrally couple the first substrate unit and the second substrate unit to each other.

The plurality of third substrate units run parallel with each other to be symmetrical with each other.

The auxiliary substrate unit includes openings formed among the plurality of third substrates.

The FPCB further includes at least one driving wiring line withdrawn from the main substrate unit and coupled to the second pad unit via at least one third substrate unit among the plurality of third substrate units.

The FPCB further includes at least one driving wiring line withdrawn from the main substrate unit and diverged to pass through the plurality of third substrate units to be coupled to the second pad unit.

The main substrate unit and the first to third substrate units of the auxiliary substrate unit are integrally molded in one sheet.

There is provided a touch screen panel apparatus, including a touch screen panel including a transparent substrate, a plurality of sensing electrodes formed on one surface of the transparent substrate and a front surface pad unit coupled to the sensing electrodes, and a driving/shield electrode formed on the other surface of the transparent substrate and a rear surface coupled to the driving/shield electrode and a FPCB including a first pad unit coupled to a front surface pad unit of the touch screen panel and a second pad unit coupled to a rear surface pad unit of the touch screen panel to be simultaneously coupled to both surfaces of the touch screen panel. The FPCB includes a main substrate unit at whose one end the first pad unit is formed and a auxiliary substrate unit having a first substrate unit extended on one side of the main substrate unit and positioned to run parallel with the first pad unit on one surface of the touch screen panel, a second substrate provided to face the first substrate unit and including the second pad unit, and a plurality of third substrate units extended from corresponding both sides of the first substrate unit and the second substrate unit to couple the first and second substrate units to each other and mounted in a state of being folded so that the first and second substrate units are positioned on different facing surfaces of the touch screen panel.

The plurality of third substrate units are mounted in a state of being folded in a horizontal direction so that the first substrate unit and the second substrate unit overlap each other.

The sensing electrodes are dispersed in an active touch region on one surface of the transparent substrate to be coupled in a first direction or a second direction.

The driving/shield electrode is formed on the other entire surface of the transparent substrate.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
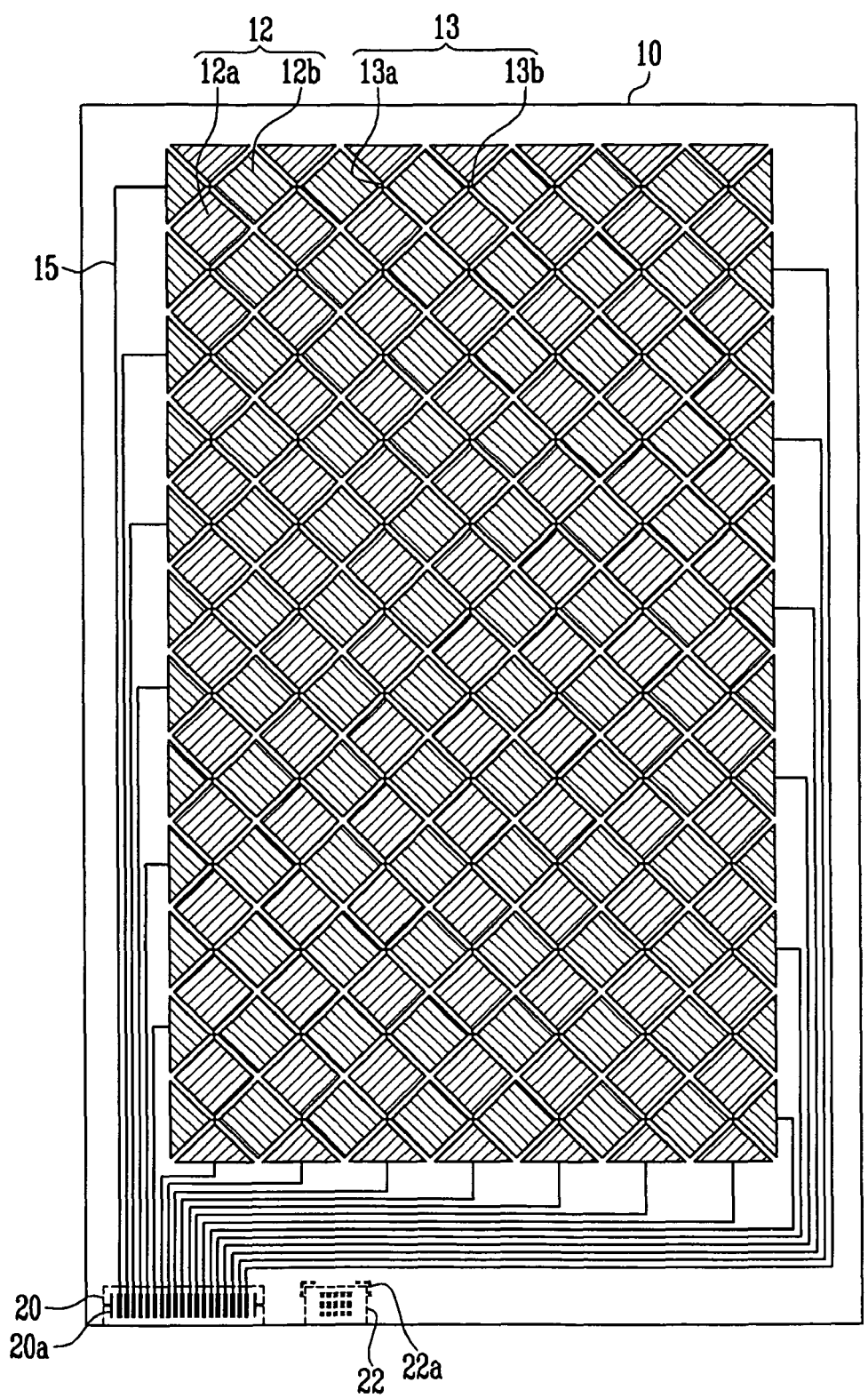
FIG. 1 illustrates a plan view of one example of a touch screen panel.

Korean Patent Application No. 10-2010-0087522, filed on Sep. 7, 2010, in the Korean Intellectual Property Office, and entitled: "Flexible Printed Circuit Board and Touch Screen Panel Device Having the Same" is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 is a plan view illustrating one example of a surface, e.g., a front surface, of a touch screen panel. Referring to FIG. 1, the touch screen panel includes a transparent substrate 10, a plurality of sensing electrodes 12, a plurality of coupling patterns 13, position detecting lines 15, and a front surface pad unit 20. The plurality of sensing electrodes 12 and coupling patterns 13 are on an active touch region of the front surface of the transparent substrate 10. The position detecting lines 15 are on an inactive touch region of the front surface of the transparent substrate 10. The position detecting lines 15 couple the sensing electrodes 12 to an external driving circuit through the front surface pad unit 20.

In addition, although not shown in the plan view of FIG. 1, a non-sensing electrode is on another surface, e.g., a rear surface, of the touch screen panel. A rear surface pad unit 22 that couples the non-sensing electrode to the external driving circuit is provided in the inactive touch region of the rear surface of the touch screen panel.

The transparent substrate 10, which serves as the base material of the touch screen panel, may be formed of a transparent material, e.g., glass or a polyethylene terephthalate (PET) film.

The sensing electrodes 12 are dispersed in the active touch region on a first surface, e.g., the front surface, of the transparent substrate 10 to be coupled in a first or second direction. Here, the active touch region may be set as a display region. In this case, the active touch region may be set as a region that overlaps pixels included in a display panel (not shown) provided under the touch screen panel.

The sensing electrodes 12 may include a plurality of first sensing electrodes 12a dispersed into the active touch region of the transparent substrate 10 to be coupled in the first direction and a plurality of second sensing electrodes 12b dispersed between the first sensing electrodes 12a to alternate with the first sensing electrodes 12a and coupled in the second direction that intersects, e.g., is orthogonal to, the first direction.

The first sensing electrodes 12a may be arranged in column lines or row lines. The first sensing electrodes 12a positioned in the same column or row line (the same column line according to the present embodiment) are coupled to each other in the first direction (a column direction according to the present embodiment) by first coupling patterns 13a arranged in the same column or row line. At this time, the first sensing electrodes 12a are coupled to the position detecting lines 15 in units of lines coupled in the first direction.

The plurality of second sensing electrodes 12b may be arranged in the row or column lines. The second sensing electrodes 12b positioned in the same row or column line (the same row line according to the present embodiment) are coupled to each other in the second direction (a row direction according to the present embodiment) intersecting the first direction by the plurality of second coupling patterns 13b arranged in the same row or column line. At this time, the second sensing electrodes 12b are coupled to the position detecting lines 15 in units of lines coupled in the second direction.

The first sensing electrodes 12a and the second sensing electrodes 12b are transparent, i.e., transmitting at least a predetermined amount of light, so that light from a display panel (not shown) provided below the touch screen panel may pass through the first sensing electrodes 12a and the second sensing electrodes 12b. For example, the first sensing electrodes 12a and the second sensing electrodes 12b may be formed of a transparent material, e.g., indium tin oxide (ITO) or indium zinc oxide (IZO).

The coupling patterns 13 include a plurality first coupling patterns 13a formed in the first direction to couple the first sensing electrodes 12a to each other in the first direction between the first sensing electrodes 12a and a plurality of second coupling patterns 13b formed in the second direction to couple the second sensing electrodes 12b to each other in the second direction between the second sensing electrodes 12b.

The position detecting lines 15 are electrically coupled to the first sensing electrodes 12a and the second sensing electrodes 12b in units of lines coupled in the first direction and the second direction to couple the first sensing electrodes 12a and the second sensing electrodes 12b to an external driving circuit (not shown), e.g., a position detecting circuit, through the front surface pad unit 20.

The position detecting lines 15 are positioned in the inactive touch region, e.g., a non-display region, defined in a periphery of the active touch region to avoid the active touch region on which an image is displayed. The position detecting lines 15 may be formed of various materials, e.g., do not need to be transparent. For example, the position detecting lines 15 may be made of a low resistance material, such as Mo, Ag, Ti, Cu, and Al, Mo/Al/Mo, other than the transparent electrode material used for forming the sensing electrodes 12.

As described above, when a finger or an object, e.g., a stylus pen, contacts the electrostatic capacity method touch screen panel, a change in electrostatic capacity in accordance with contact position is transmitted from the sensing electrodes 12 to a driving circuit (not shown) via the position detecting lines 15 and the front surface pad unit 20. Then, a change in electrostatic capacity is converted into an electric signal by an X and Y input processing circuit (not shown) so that the contact position is determined.

The touch screen panel may further include a non-sensing electrode (not shown) formed in a second surface, e.g., the rear surface that faces the front surface where the first and second sensing electrodes 12a and 12b are formed. That is, the sensing electrodes 12 and the non-sensing electrode may be formed on opposing surfaces of the touch screen panel. The non-sensing electrode may be used, e.g., as another driving electrode than the first and second sensing electrodes 12a and 12b or may be used as a shield electrode for securing stability between the touch screen panel and the display panel under the touch screen panel.

The front surface pad unit 20 includes a plurality of pads coupled to the sensing electrodes 12 through the position detecting lines 15. An aligning mark 20a for facilitating alignment when the front surface pad unit 20 is coupled to a FPCB (not shown) may be formed on at least one side of the front pad unit 20.

The rear surface pad unit 22 for coupling the non-sensing electrode formed on the other surface of the touch screen panel to an external driving circuit is coupled to the non-sensing electrode. Therefore, the rear surface pad unit 22 may include at least one pad for exposing one region of the non-sensing electrode or may include at least one pad coupled to the non-sensing electrode through another signal/power source wiring line (not shown) or a conductive material. An aligning mark 22a for facilitating alignment when the rear surface pad unit 22 is coupled to the FPCB may be formed in the peripheral region of the rear surface pad unit 22.

Figure 2A:
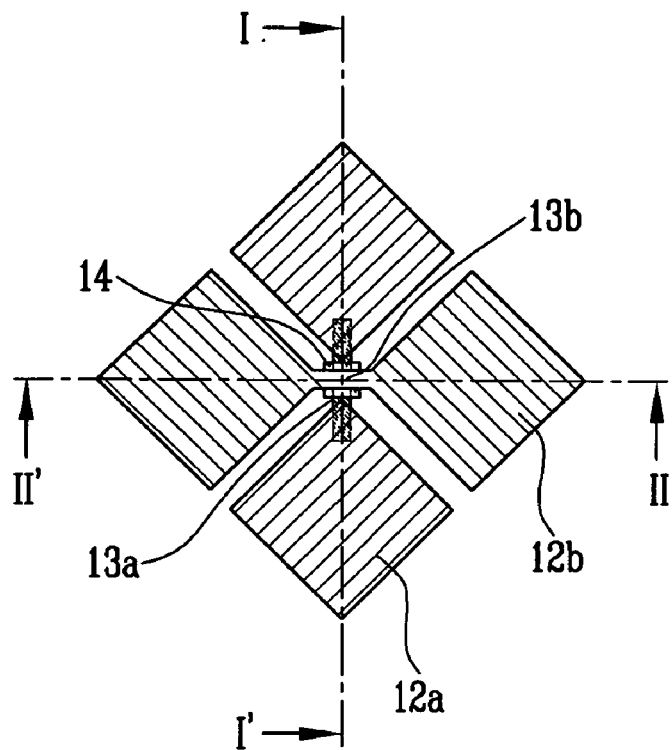
FIGS. 2A and 2B illustrate enlarged views of main elements in one example of sensing electrodes and coupling patterns illustrated in FIG. 1.
Figure 2B:
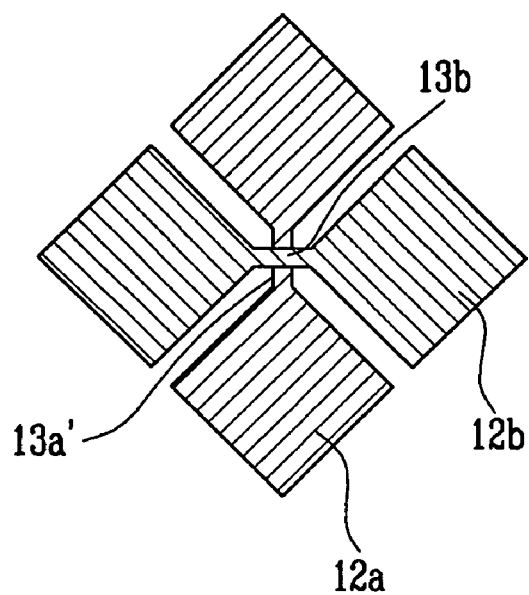

FIGS. 2A and 2B are enlarged views illustrating main elements in one example of the sensing electrodes and the coupling patterns illustrated in FIG. 1. FIG. 2A illustrates one example of the touch screen panel with a one-layer structure in which the first sensing electrodes 12a and the second sensing electrodes 12b are formed on the same layer. FIG. 2B illustrates one example of the touch screen panel with a two-layer structure in which the first sensing electrodes 12a and the second sensing electrodes 12b are formed on different layers.

Referring to FIG. 2A, the first sensing electrodes 12a and the second sensing electrodes 12b are alternately disposed on the same layer so that the first sensing electrodes 12a are coupled to each other in the first direction by the first coupling patterns 13a and the second sensing electrodes 12b are coupled to each other in the second direction by the second coupling patterns 13b.

An insulating layer 14 for securing stability (insulating property) is interposed between the first coupling patterns 13a and the second coupling patterns 13b. That is, the first coupling patterns 13a and the second coupling patterns 13b are located on different layers with the insulating layer 14 interposed therebetween.

For example, the first coupling patterns 13a are located above or below the insulating layer 14, on which the first sensing electrodes 12a and the second sensing electrodes 12b are located, and are coupled to the first sensing electrodes 12a through contact holes or direct contact. The second coupling patterns 13b may be patterned to be integrated with the second sensing electrodes 12b. In such a case, the first sensing electrodes 12a may be separately patterned such that they have independent patterns and may be coupled to each other in the first direction by the first coupling patterns 13a.

However, embodiments are not limited thereto, i.e., the first sensing electrodes 12a and the second sensing electrodes 12b are not always located on the same layer. For example, they may also be alternately disposed on different layers.

In such a case, as illustrated in FIG. 2B, the first coupling patterns 13a and the first sensing electrodes 12a may be located on the same layer and the first coupling patterns 13a may be integrally patterned with the first sensing electrodes 12a. The second coupling patterns 13b and the second sense cells 12b may be located on the same layer and the second coupling patterns 13b may be integrally patterned with the second sensing electrodes 12b.

In such a case, an insulating layer (not shown) may be interposed on the area including the active touch region between the layer on which the first sensing electrodes 12a and the first coupling patterns 13a are formed, and the layer on which the second sensing electrodes 12b and the second coupling patterns 13b are formed.

Figure 3A:
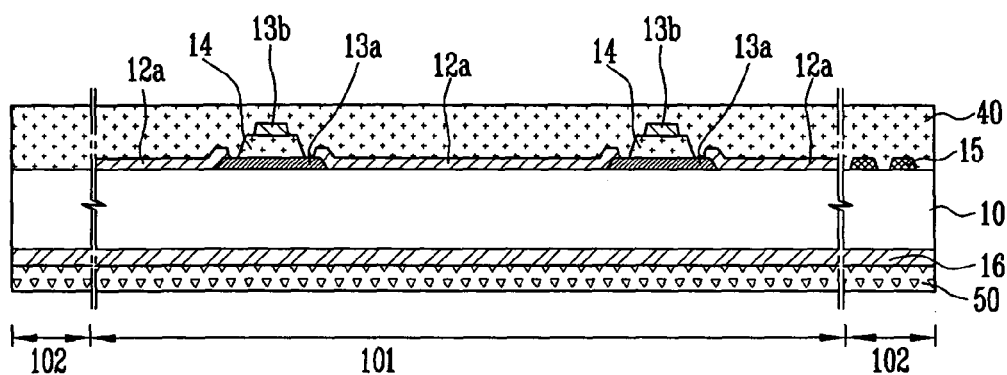
FIGS. 3A and 3B illustrate sectional views of main elements of a touch screen panel illustrated in FIG. 1.
Figure 3B:
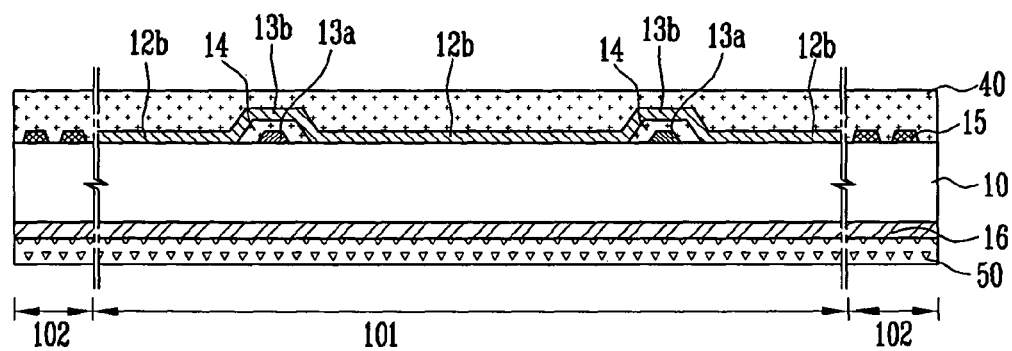

FIGS. 3A and 3B are sectional views illustrating main elements of the touch screen panel according to one embodiment. FIG. 3A is a sectional view taken along line I-I' illustrated in FIG. 2A and FIG. 3B is a sectional view taken along line II-II' of FIG. 2A.

Referring to FIGS. 3A and 3B, the first and second sensing electrodes 12a and 12b and the first and second coupling patterns 13a and 13b are formed on an active touch region 101 of one surface (for example, the top surface) of the transparent substrate 10, and an insulating layer 14 for securing stability is interposed between the first coupling patterns 13a and the second coupling patterns 13b. Furthermore, the position detecting lines 15 are formed on an inactive touch region 102 outside the active touch region of the one surface of the transparent substrate 10.

The insulating layer 14 is formed to expose one area of the first coupling patterns 13a, e.g., both ends of the first coupling patterns 13a, coupled to the first sensing electrodes 12a. As the exposed both ends of the first coupling patterns 13a are coupled to the first sensing electrodes 12a, the first sensing electrodes 12a are coupled to each other in the first direction, e.g., the column direction.

The second coupling patterns 13b may be patterned to be integrally coupled with the second sensing electrodes 12b in the second direction, e.g., the row direction, via the upper portion of the insulating layer 14. Thus, the second sensing electrodes 12b are coupled to each other in the second direction.

FIGS. 3A and 3B illustrate one example of the sections of the sensing cells and the coupling patterns provided in the touch screen panel with a one-layer structure as illustrated in FIG. 2A. For convenience sake, in FIGS. 3A and 3B, the insulating layer 14 is locally interposed only in the intersections of the first coupling patterns 13a and the second coupling patterns 13b.

However, embodiments are not limited thereto. For example, an insulating layer may be formed throughout the active touch region, and sensing electrodes (for example, the first sensing electrodes 12a) located at a different layer may also be electrically coupled to coupling patterns (for example, the first coupling patterns 13a) through contact holes formed in the insulating layer.

Furthermore, in FIGS. 3A and 3B, the first coupling patterns 13a are located under the insulating layer 14 and the second coupling patterns 13b are located on the insulating layer 14. However, the positions of the first coupling patterns 13a and the second coupling patterns 13b may also be reversed.

The active touch region 101 is transparent so that light from a display panel (not shown) disposed below the touch screen panel may pass through the active touch region 101. That is, the first and second sensing electrodes 12a and 12b, the second coupling patterns 13b, the insulating layer 14, and the like are formed of a transparent material with a transparency of a predetermined value or more. Herein, the transparency comprehensively includes transparency with high transmittance as well as complete transparency of 100%.

To this end, the first and second sensing electrodes 12a and 12b and the second coupling patterns 13b are formed of a transparent electrode material, e.g., ITO or IZO, and the insulating layer 14 is formed of a transparent insulating material, e.g., silicon oxide ($SiO_2$).

Furthermore, the first coupling patterns 13a may be formed of a transparent electrode material, similarly to the first and second sensing electrodes 12a and 12b and the second coupling patterns 13b, or of an opaque low resistance metal similarly to the position detecting lines 15. The line width, length, thickness, and the like of the first coupling patterns 13a may be adjusted such that the first coupling patterns 13a are prevented from being viewed.

A non-sensing electrode 16 is formed on the other surface (for example, the rear surface) of the transparent substrate 10. The non-sensing electrode 16 made of a transparent electrode material, e.g., ITO or IZO, may be formed on the other surface of the transparent substrate 10.

Such a non-sensing electrode 16 may be used as a separate driving electrode other than the first and second sensing electrodes 12a and 12b receiving a driving signal of the touch screen panel, or may be coupled to a constant voltage source such as a ground power source to be used as a shield electrode for securing stability between the touch screen panel and the display panel disposed below the touch screen panel.

For example, in the capacitive touch screen panel, in order to detect a contact position, capacitance between the first sensing electrodes 12a and the second sensing electrodes 12b may be used or capacitance between the first and second sensing electrodes 12a and 12b and the non-sensing electrode 16 may be used. Various modifications may be made.

Embodiments are not limited to the above. A second protective layer 50 may be additionally formed on the entire rear surface of the transparent substrate 10 where the non-sensing electrode 16 is formed. The second protective layer 50 may be opened to expose the pads provided in the rear surface pad unit 22 in the rear surface pad unit 22 illustrated in FIG. 1.

As described above, according to the present embodiment, when the sensing electrodes 12a and 12b and the non-sensing electrode 16 are formed on both surfaces of the touch screen panel, since the FPCB is to be coupled to opposing surfaces of the touch screen panel, a coupling structure becomes complicated and the correctness of alignment or stability of coupling may deteriorate.

Therefore, according to embodiments, an FPCB that may be simultaneously coupled to both surfaces of a substrate structure such as the touch screen panel, while being correctly aligned and having improved coupling stability, and a touch screen panel apparatus having the same, are disclosed. Detailed description will be made with reference to FIGS. 4 to 6.

Figure 4:
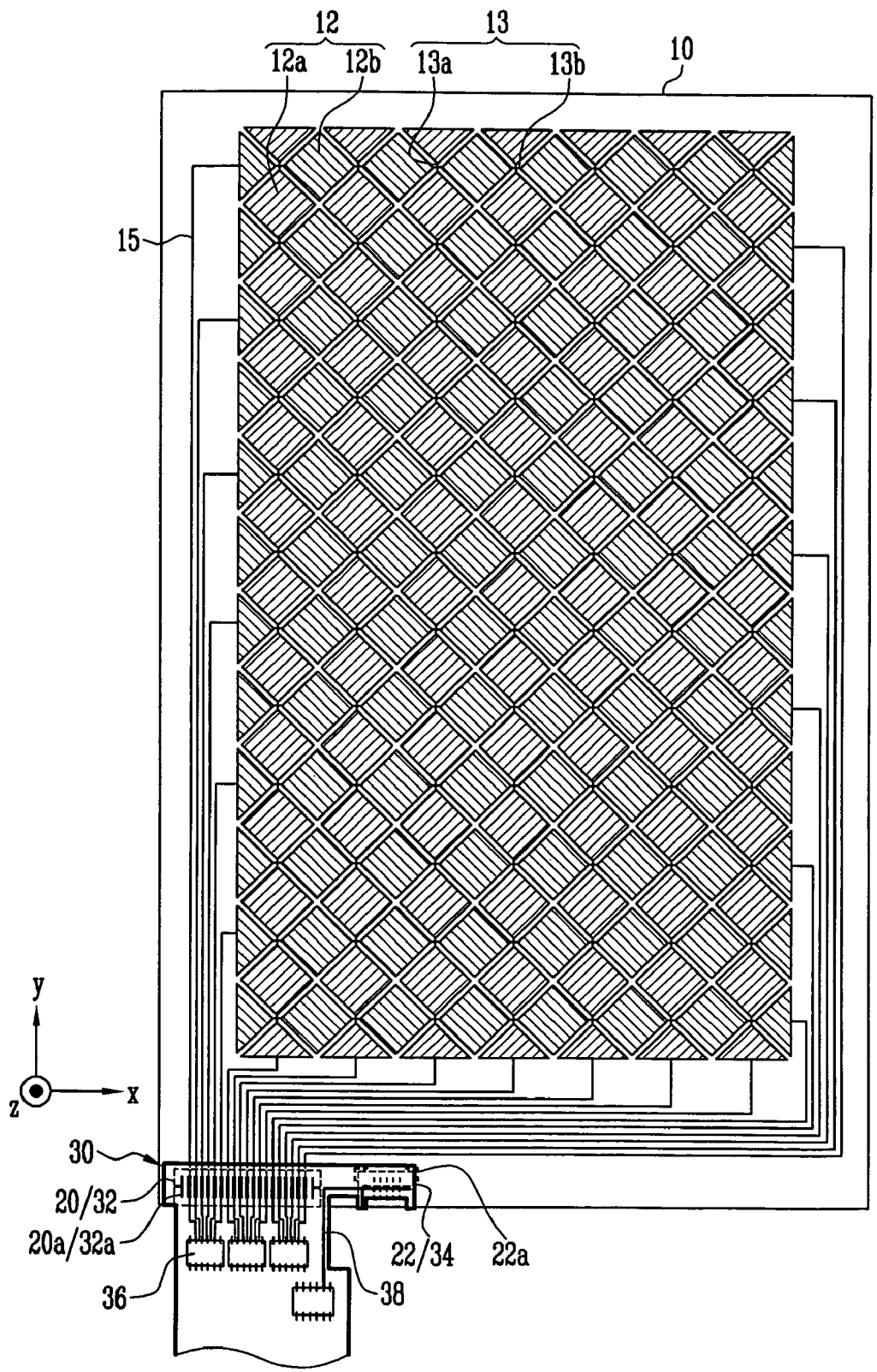
FIG. 4 illustrates a plan view of a flexible printed circuit board (FPCB) according to an embodiment and a touch screen panel apparatus having a touch screen panel coupled to the FPCB.
Figure 5:
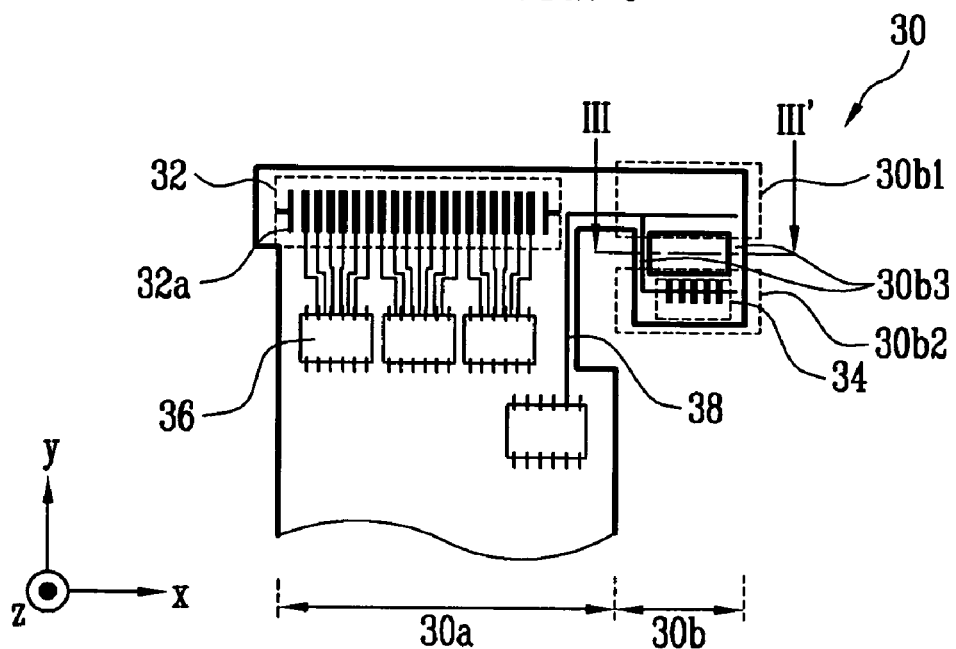
FIG. 5 illustrates a plan view of the FPCB illustrated in FIG. 4.
Figure 6:
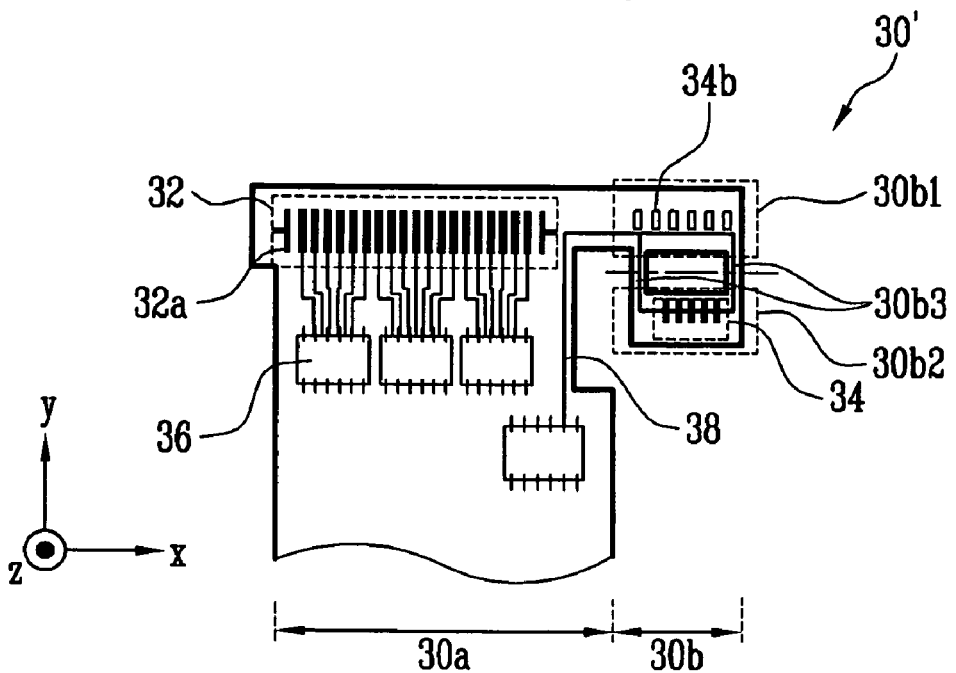
FIG. 6 illustrates a plan view of an FPCB according to another embodiment.

FIG. 4 is a plan view illustrating a flexible printed circuit board (FPCB) according to an embodiment and a touch screen panel apparatus having a touch screen panel coupled to the FPCB. FIG. 5 is a plan view illustrating the FPCB illustrated in FIG. 4. FIG. 6 is a plan view illustrating an FPCB according to another embodiment of the present invention.

For convenience sake, in FIGS. 4 to 6, detailed description of the structure of the touch screen panel described with reference to FIGS. 1 to 3B will not be repeated.

First, referring to FIGS. 4 and 5, a touch screen panel apparatus includes a touch screen panel and an FPCB 30 simultaneously coupled to the front surface pad unit 20 and the rear surface pad unit 22 formed on opposing surfaces of the touch screen panel.

In detail, the FPCB 30 includes a main substrate unit 30a including a first pad unit 32 coupled to the front surface pad unit 20 of the touch screen panel and an auxiliary substrate unit 30b including a second pad unit 34 extending from one side of the main substrate unit 30a and coupled to the rear surface pad unit 22 of the touch screen panel.

In detail, the main substrate unit 30a includes the first pad unit 32 formed on one end and driving elements 36 coupled to pads provided in the first pad unit 32. The driving elements 36 are not necessarily provided in the main substrate unit 30a and may be used as media for coupling the touch screen panel to another driving substrate.

In addition, an aligning mark 32a for facilitating alignment when the first pad unit 32 is coupled to the front surface pad unit 20 of the touch screen panel may be provided in or adjacent to the first pad unit 32. For example, the aligning mark 20a of the front surface pad unit 20 and the aligning mark 32a of the first pad unit 32 may be formed to correspond to each other, e.g., overlap, when the front surface pad unit 20 and the first pad unit 32 are properly aligned.

The auxiliary substrate unit 30b extending from the main substrate unit 30a to one side of the first pad unit 32 includes a first substrate unit 30b1, a second substrate unit 30b2 including the second pad unit 34, and a plurality of third substrate units 30b3. The first substrate unit 30b1 is provided parallel with the first pad unit 32, e.g., offset from the first pad unit 32 in an x-direction and extending from the main substrate 30a. When the FPCB is mounted on the touch screen panel, as shown in FIG. 4, the second substrate unit 30b2 faces, e.g., overlaps, the first substrate unit 30b1. Before the FPCB is mounted on the touch screen panel, as shown in FIGS. 5 and 6, the second substrate unit 30b2 is offset from the first substrate unit 302b1 along a first direction, e.g., along a y-axis. The plurality of third substrate units 30b3 extend between the first substrate unit 30b1 and the second substrate unit 30b2 to couple the first and second substrate units 30b1 and 30b2. For example, one of the third substrate units 30b3 may extend from a left most side of the second substrate unit 30b2 and another third substrate unit 30b3 may extend from a right most side of the second substrate unit 30b2.

The respective regions of the FPCB 30 are illustrated as being separate from each other. However, the respective regions of the FPCB 30 may be integrated with each other. That is, the main substrate unit 30a and the first to third substrates 30b1, 30b2, and 30b3 of the auxiliary substrate unit 30b may be integrally molded in one sheet.

The first pad unit 32 and the first substrate unit 30b1 of the FPCB 30 are positioned on the front surface of the touch screen panel. Therefore, relative to the FPCB 30, the first pad unit 32 is formed on a bottom surface of the FPCB 30, such that the first pad unit 32 contacts the front surface pad unit 20 of the touch screen panel. In FIGS. 4 and 5, in order to clearly illustrate the pad units, the first and second pad units 32 and 34 are denoted by solid lines.

The second substrate unit 30b2 is coupled to the first substrate unit 30b1 by the plurality of third substrate units 30b3 extended between the first substrate unit 30b1 and the second substrate unit 30b2. Before the FPCB is mounted on the touch screen panel, the second substrate unit is spaced apart from the first substrate unit along a second direction, e.g., along a y-direction.

When the FPCB is mounted on the touch screen panel, the second pad unit 34 of the second substrate unit 30b2 is coupled to the rear surface pad unit 22 of the touch screen panel. In particular, the second pad unit 34 is provided on the bottom surface of the FPCB 30 such that, when the plurality of third substrate 30b3 are bent around the touch screen panel, the second pad unit is coupled to the rear surface pad unit 22. Thus, when the FPCB is mounted on the touch screen panel, the first substrate unit 30b1 and the second substrate unit 30b2 may be arranged to overlap each other on opposing surfaces of the touch screen panel, e.g., in the x and y direction along a z-axis.

As noted above, when the FPCB is mounted on the touch screen panel, the plurality of third substrate units 30b3 may be folded in a horizontal direction, e.g., along the z-axis. For example, the plurality of third substrate units 30b3 may be mounted be folded as illustrated in FIG. 4 along the line illustrated in FIG. 5. In other words, the plurality of third substrate units 30b3 may extend along an edge portion of the substrate 10 that connects the front and rear surfaces of the touch screen panel.

The plurality of third substrate units 30b3 for coupling the first and second substrate units 30b1 and 30b2 to each other may be arranged to be symmetrical with each other on both sides corresponding to each other of the first and second substrate units 30b1 and 30b2. When integral with the first and/or second substrate units, an opening may be formed between the plurality of third substrate units 30b3.

As described above, when the plurality of second substrate units 30b3 are formed to couple the first and second substrate units 30b1 and 30b2 to each other on both sides corresponding to each other of the first and second substrate units 30b1 and 30b2, tension/stress generated due to the third substrate units 30b3 being folded may be dispersed and both the first and second substrate units 30b1, 30b2 of the auxiliary substrate unit 30b may be stably supported.

Therefore, it is possible to prevent the auxiliary substrate unit 30b from being twisted, thereby improving alignment and coupling stability between the touch screen panel and the FPCB 30, and to prevent or reduce generation of a crack in the third substrate unit 30b3. In addition, according to embodiments, since one integrated FPCB 30 may be coupled to both surfaces of the touch screen panel, the coupling structure between the FPCB 30 and the touch screen panel may be simplified.

Additionally, the second pad unit 34 in the auxiliary substrate unit 30b may receive a driving signal (or a driving power source) for driving the non-sensing electrode (16 of FIGS. 3A and 3B) from the driving element mounted in the main substrate unit 30a or the driving element coupled via the main substrate unit 30a. Therefore, the FPCB 30 may include at least one driving wiring line 38 from the main substrate unit 30a and coupled to the second pad unit 34 via at least one third substrate unit 30b3 among the plurality of third substrate units 30b3, e.g., the third substrate unit 30b3 adjacent to the main substrate unit 30a.

As illustrated in FIG. 6, the driving wiring line 38 may be diverged from the main substrate unit 30a to pass through the plurality of third substrate units 30b3 to be coupled to the second pad unit 34. In this case, due to the routing effect of the plurality of wiring lines, even if a crack is generated in one third substrate unit 30b3, since the driving signal may be received through the driving wiring line 38 that passes through another third substrate unit 30b3, driving defect may be prevented.

Further, as shown in FIG. 6, an aligning mark 34b for facilitating the selection of a position on the touch screen panel may be provided in the first substrate unit 30b1. The aligning mark 34b may overlap the rear surface pad unit. In this case, an aligning mark corresponding to the aligning mark 34b of the first substrate unit 30b1 may be formed on the front surface of the touch screen panel.

By way of summation and review, when the sensing electrodes and the non-sensing electrode are formed on both surfaces of the touch screen panel, when an FPCB is to be coupled to both surfaces of the touch screen panel, a coupling structure may be complicated and alignment and/or coupling stability may deteriorate. As described above, embodiments provide a FPCB having a simple, stable structure that may be accurately aligned, As described above, according to embodiments, the main substrate unit including the first pad unit coupled to one surface of the substrate structure, e.g., a touch screen panel, and the auxiliary substrate unit integrally formed with the main substrate unit and including the second pad unit coupled to the other surface of the substrate structure are provided, so that the FPCB capable of being simultaneously coupled to both surfaces of the substrate structure is provided. Therefore, the coupling structure of both surfaces of the substrate structure, e.g., a touch screen panel, and the FPCB coupled to the both surfaces of the touch screen panel may be simplified.

In particular, according to embodiments, the FPCB includes a plurality of third substrate units of the auxiliary substrate unit folded from one surface of the substrate structure to an opposite surface are formed so that tension generated due to the folding of the third substrate units is dispersed and both sides of the auxiliary substrate unit are stably supported. Therefore, it is possible to prevent the auxiliary substrate unit from being twisted so that alignment and coupling stability between the substrate structure and the FPCB may be improved and generation of a crack may be prevented or reduced.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A flexible printed circuit board (FPCB), comprising:
a main substrate unit having a first pad unit; and
an auxiliary substrate unit extending from the main substrate unit to one side of the first pad unit,
wherein the auxiliary substrate unit includes:
a first substrate unit positioned parallel with the first pad unit along a first direction;
a second substrate unit including a second pad unit, the second substrate unit spaced apart from the first substrate unit in a second direction, orthogonal to the first direction; and
a plurality of third substrate units extending along the second direction between the first and second substrate units.

2. The FPCB as claimed in claim 1, wherein at least two third substrate units are parallel with each other and symmetrical with each other.

3. The FPCB as claimed in claim 1, wherein the auxiliary substrate unit comprises openings formed between the plurality of third substrate units.

4. The FPCB as claimed in claim 1, wherein the second pad unit is configured to receive at least one driving wiring line from the main substrate unit via at least one third substrate unit of the plurality of third substrate units.

5. The FPCB as claimed in claim 4, wherein the second pad unit is configured to receive at least one driving wiring line from the main substrate unit via all of the plurality of third substrate units.

6. The FPCB as claimed in claim 1, wherein the main substrate unit and the first to third substrate units of the auxiliary substrate unit are integrally molded in one sheet.

7. A touch screen panel apparatus, comprising:
a touch screen panel including:
a transparent substrate,
a plurality of sensing electrodes on a first surface of the transparent substrate,
a front surface pad unit coupled to the sensing electrodes,
a non-sensing electrode on a second surface of the transparent substrate, the second surface being opposite the first surface; and
a rear surface pad unit coupled to the non-sensing electrode; and
a FPCB including a first pad unit coupled to the front surface pad unit of the touch screen panel and a second pad unit coupled to the rear surface pad unit of the touch screen panel,
wherein the FPCB includes:
a main substrate unit having the first pad unit; and
an auxiliary substrate unit having:
a first substrate unit extending from one side of the main substrate unit parallel with the first pad unit on the first surface of the touch screen panel,
a second substrate unit including the second pad unit, the second substrate unit on the second surface of the touch screen panel and facing the first substrate unit through the transparent substrate; and
a plurality of third substrate units extending between the first substrate unit and the second substrate unit to couple the first and second substrate units to each other.

8. The touch screen panel apparatus as claimed in claim 7, wherein third substrate units are parallel and symmetrical with each other.

9. The touch screen panel apparatus as claimed in claim 7, wherein the auxiliary substrate unit comprises openings between adjacent third substrate units.

10. The touch screen panel apparatus as claimed in claim 7, wherein third substrate units are folded around the touch screen panel so that the first substrate unit and the second substrate unit overlap each other.

11. The touch screen panel apparatus as claimed in claim 7, wherein at least one driving wiring line from the main substrate unit is coupled to the second pad unit via at least one third substrate among the plurality of third substrate units.

12. The touch screen panel apparatus as claimed in claim 11, wherein at least one driving wiring line from the main substrate unit is coupled to the second pad unit via all of the plurality of third substrate units.

13. The touch screen panel apparatus as claimed in claim 7, wherein the sensing electrodes are in an active touch region on the first one surface of the transparent substrate and are to be coupled in a first direction or a second direction.

14. The touch screen panel apparatus as claimed in claim 7, wherein the non-sensing electrode is formed in an inactive touch region on the second surface of the transparent substrate.

* * * * *